United States Patent [19]

Prabhu et al.

[11] Patent Number: 4,810,420

[45] Date of Patent: Mar. 7, 1989

[54] THICK FILM COPPER VIA-FILL INKS

[75] Inventors: Ashok N. Prabhu, East Windsor Township, Mercer County; Kenneth W. Hang, West Windsor, Mercer County, both of N.J.; Simon M. Boardman, Holland, Pa.

[73] Assignee: General Electric Company, Schenectady, N.Y.

[21] Appl. No.: 914,296

[22] Filed: Oct. 2, 1986

[51] Int. Cl.$^4$ .............................................. H01B 1/06
[52] U.S. Cl. ................................. 252/512; 106/1.13; 106/20; 501/69; 501/73; 501/77
[58] Field of Search ................... 174/68.5; 252/512; 106/1.13, 20; 523/160; 501/69, 73, 77

[56] References Cited

U.S. PATENT DOCUMENTS

| | | | |
|---|---|---|---|
| 3,022,179 | 2/1962 | Morrissey | 106/39 |
| 3,501,322 | 3/1970 | Dumbaugh, Jr. et al. | 106/48 |
| 3,876,407 | 4/1975 | Hirose et al. | 65/30 |
| 4,061,584 | 12/1977 | Girard et al. | 252/63 |
| 4,256,796 | 3/1981 | Hang et al. | 428/210 |
| 4,355,114 | 10/1982 | Hang et al. | 501/5 |
| 4,355,115 | 10/1982 | Hang et al. | 501/21 |
| 4,369,220 | 1/1983 | Prabhu et al. | 428/209 |
| 4,369,254 | 1/1983 | Prabhu et al. | 501/21 |
| 4,376,725 | 3/1983 | Prabhu et al. | 252/512 |
| 4,377,642 | 3/1983 | Prabhu et al. | 501/20 |
| 4,379,195 | 4/1983 | Prabhu et al. | 428/209 |
| 4,380,750 | 4/1983 | Prabhu et al. | 338/308 |
| 4,385,127 | 5/1983 | Chyung | 501/5 |
| 4,399,320 | 8/1983 | Prabhu et al. | 174/68.5 |
| 4,400,214 | 8/1983 | Ogawa et al. | 106/1.13 |
| 4,415,624 | 11/1983 | Prabhu et al. | 428/209 |
| 4,452,844 | 6/1984 | Prabhu et al. | 428/209 |
| 4,467,009 | 8/1984 | Prabhu et al. | 428/210 |
| 4,514,321 | 4/1985 | Suita | 252/512 |
| 4,521,329 | 6/1985 | Suita et al. | 252/512 |
| 4,536,535 | 8/1985 | Usala | 524/403 |
| 4,540,604 | 9/1985 | Suita | 106/1.13 |
| 4,594,181 | 6/1986 | Suita | 252/512 |
| 4,600,604 | 7/1986 | Suita | 252/512 |
| 4,623,482 | 11/1986 | Kuo et al. | 252/512 |

FOREIGN PATENT DOCUMENTS 0084936 8/1983 European Pat. Off. .
174544 10/1984 Japan .

*Primary Examiner*—Josephine Barr
*Attorney, Agent, or Firm*—James Magee, Jr.; James C. Davis, Jr.

[57] ABSTRACT

An improved copper via-fill ink for forming post-ups in a thick dielectric layer separating two patterned layers of copper conductor in a multilayer circuit assembly is provided. The via-fill ink comprises copper powder, a suitable organic vehicle and a glass frit consisting of a devitrifying glass and a vitreous glass. The devitrifying glass is a zinc-magnesium-barium-aluminum-zirconium-phosphosilicate glass and the vitreous glass is a barium-calcium-borosilicate glass.

9 Claims, No Drawings

THICK FILM COPPER VIA-FILL INKS

This invention relates to thick film copper conductor inks and their use in fabricating multilayer electrical circuit structures. More particularly, this invention relates to copper conductor inks which are useful in filling vias in the thick dielectric layer which conventionally separates patterned copper conductor layers in a multilayer circuit structure.

BACKGROUND OF THE INVENTION

The use of specialized ink formulations to form thick films having various functions on suitable substrates in the construction of multilayer integrated circuits is known in the art. Such technology is of increasing interest in the production of very dense multilayer circuit patterns on various substrates for a wide variety of applications in the electronics industry.

Thick film multilayer structures based on copper conductors typically are comprised of at least two patterned layers of copper conductor separated by a dielectric layer. The patterned conductor layers are connected by copper deposited in vias in the dielectric layer. Such structures are formed by multiple deposition and firing of layers of copper and dielectric inks.

Such multilayer circuit structures utilizing copper as the conductor metal have a number of problems. The most common is failure caused by the development of electrical shorts due to interactions between flux materials of the copper conductor ink and the dielectric layer which take place during the multiple firings necessary to fabricate a multilayer integrated circuit. Such materials include copper oxide which forms upon exposure of the ink to air or an oxidizing atmosphere and flux materials such as lead oxide and bismuth oxide. These materials will penetrate a porous dielectric material, particularly if it contains large modifier ions such as lead, barium and bismuth.

In complex, multilayer, copper-based circuits, the problems and potential incompatibilities for a given copper conductor ink will vary somewhat depending on how it is being utilized. For example, the initial or bottom layer of copper ink must be formulated to adhere well to the substrate, e.g. alumina, and to have a coefficient of expansion such that it will not separate from the substrate during repeated firings at elevated temperatures. The top layer of copper conductor ink must be formulated to have excellent solderability, yet be resistant to having flux components leach into porous neighboring dielectric layers. If the dielectric layer is sufficiently porous so that flux components can form an unbroken contact between overlying and underlying copper conductors, an electrical short will be produced when the device is operated. The copper conductor inks used for via fill or "post-up" structures between layers of copper conductor have a third set of requirements.

Via-fill copper conductor inks are conventionally printed onto a substrate having a patterned layer of copper conductor alternatively with dielectric inks to incrementally build a thickness of 2 to 20 mils or more. The copper via-fill conductor overlies and connects to the first layer of copper and is surrounded by dielectric material. The coefficient of expansion of conventional copper inks is usually more than twice that of conventional dielectric materials. The effect of this difference is, of course, significantly more pronounced in a thick structure, such as via-fill, which is surrounded by dielectric than in a thin, patterned, copper conductor layer which is sandwiched between two layers of dielectric material. For this reason, copper via-fills, also termed "post-ups", are subject to microcracking where they join the patterned layers of copper conductor.

The microcracking problem alluded to above can be reduced by increasing the amount of vitreous glass in the via-fill formulations. However, this leads to an increased penetration of flux phases into the dielectric material. The use of such low temperature glasses also increases the absorption of glass into the dielectric material. The loss in volume of the copper via resulting from low temperature glass diffusing into the surrounding dielectric, combined with the fact that the copper is continuously being sintered by repeated firings at elevated temperatures, can produce an even more serious result, i.e. the copper post-up contracts to the point where it will separate from one or both of the patterned copper conductor layers it is to connect.

In accordance with this invention, there has been found a formulation for copper via-fill ink which minimizes both of the aforementioned problems.

SUMMARY OF THE INVENTION

The copper conductor via-fill inks of this invention are comprised of copper powder, a glass frit comprised of a major portion of a devitrifying glass and a minor portion of a viteous glass and a suitable organic vehicle. The subject inks are resistant to microcracking and separation of copper via-fills formed therefrom. The subject inks are particularly useful in the fabrication of multilayer integrated circuit structure.

DETAILED DESCRIPTION OF THE INVENTION

The copper conductor via-fill inks of this invention are comprised of copper powder, a glass frit comprised of a major portion of a devitrifying glass and a minor portion of a vitreous glass and a suitable organic vehicle.

The copper powder utilized in the subject conductive inks is pure copper having a particle size of about 1 to 5 micrometers. The copper comprises from about 55 to 80, preferably about 60 to 70, percent by weight of the subject ink compositions.

The glass frit of the subject ink compositions is a combination of a zinc-magnesium-barium-aluminum-zirconium-phosphosilicate devitrifying glass and a barium-calcium-borosilicate vitreous glass. Conventional copper conductor inks typically do not contain devitrifying glasses since they tend to have an adverse effect on the flow and surface tension requirements for the sintering of copper ink. Unexpectedly, this is not a problem in the subject frit since the vitreous glass minimizes this effect and provides adequate sintering of the copper during the initial firing. The presence of the devitrifying glass provides support for the via-fill during subsequent firings since it does not readily flow and diffuse into the dielectric material. Since the amount of vitreous glass in the subject frits is comparatively small, the tendency of the frit to diffuse into adjacent dielectric materials is minimized.

A final advantage of the subject glass frits is that they may be utilized in the via-fill inks of this invention in comparatively large quantities. It is known that microcracking and separation of copper via-fills can be reduced by simply increasing the percentage of glass therein. Although this has a positive effect on the problem of microcracking and separation, it has a negative effect on the problem of diffusion of flux phases into the surrounding dielectric material. Therefore, in order to balance these considerations, conventional copper inks typically contain a maximum of about 15 percent by weight of the glass frit. Unexpectedly, the subject copper via-fill inks have acceptable properties, yet contain up to about 30 percent by weight of the combined glass frits. The explanation for this is not known with certainty.

The combined glass frit suitably comprises from about 15 to about 30, preferably from about 18 to 25, percent by weight of the subject inks. The frit itself is composed of form about 70 to 95, preferably from about 75 to 85, percent by weight of the devitrifying glass and from about 5 to 30, preferably from about 15 to 25, percent by weight of the vitreous glass. It is preferred in accordance with this invention that the weight ratio of the devitrifying frit to the vitreous frit be from about 2:1 to about 20:1, preferably from about 3:1 to about 5:1.

The devitrifying glass component of the subject glass frits consists of, on a weight basis:
(a) from about 15 to about 25 percent of zinc oxide;
(b) from about 10 to about 25 percent of magnesium oxide;
(c) from about 3 to about 12 percent of barium oxide;
(d) from about 5 to about 20 percent of aluminum oxide;
(e) from about 35 to about 50 percent of silicon dioxide;
(f) from about 0.5 to about 3 percent of phosphorus pentoxide; and
(g) from about 1 to about 5 percent of zirconium silicate.

Preferred devitrifying components of the subject glass frit contain, on a weight basis: from about 16 to about 22 percent of zinc oxide; from about 16 to about 22 percent of magnesium oxide; from about 5 to about 10 percent of barium oxide; from about 8 to about 11 percent of aluminum oxide; from about 39 to 43 percent of silicon dioxide; from about 1 to about 2 percent of phosphorus pentoxide; and from about 2 to about 3 percent of zirconium silicate.

The vitreous glass component of the subject glass frit comprises, on a weight basis:
(a) from about 40 to 55, preferably about 52, percent of barium oxide;
(b) from about 10 to 15, perferably about 12, percent of calcium oxide;
(c) from about 14 to 25, preferably about 16, percent of boron trioxide; and
(d) from about 13 to 23, preferably about 20, percent of silicon dioxide.

The organic vehicles are solutions of resin binders such as, for example, cellulose derivatives, particularly ethyl cellulose, synthetic resins such as polyacrylates, polymethacrylates, polyesters, polyolefins and the like in a suitable solvent. A preferred binder is poly(isobutylmethacrylate). In general, conventional solvents utilized in inks of the type described herein may be used. Preferred commercially available solvents include, for example, pine oil, terpineol, butyl carbitol acetate, 2,2,-4trimethyl-1,3-pentanediol monoisobutyrate, available from Texas Eastman Company under the trademark Texanol and the like. The vehicles suitably contain from about 5 to about 25 percent by weight of the resin binder.

The above resin binders may be utilized individually or in any combination of two or more. A suitable viscosity modifier can be added to the resin material, if desired. Such a modifier can be, for example, a castor oil derivative available from NL Industries under the trademark Thixatrol.

The vehicle of the subject inks may also contain up to about 25 percent, preferably from about 10 to about 20 percent by weight, based on the vehicle, of a suitable wetting agent of the type conventionally used in copper conductor inks to aid in coating the particles of copper powder with the organic vehicle. As is the case with all components of the organic vehicle, the wetting agent must fire cleanly in nitrogen, i.e., without leaving a carbonaceous residue. A preferred wetting agent is a dispersion of a complex multifunctional, aliphatic hydrocarbon in an aliphatic hydrocarbon oil available under the trademark Bypothiolate 100 from Central Compounding Company, Chicago, Illinois. The vehicles also suitably contain from about 0.5 to about 10, preferably from about 1 to about 3, percent by weight of a suitable surfactant such as oleylamine, available as Armeen O, or a high molecular weight N-alkyl-1,3-diaminopropane dioleate, available as Duomeen TDO, both from AKZO Chemie America. The organic vehicle comprises from about 5 to about 25, preferably from about 15 to about 20, percent by weight of the subject inks. Regardless of the vehicle utilized, it is important that the homogeneity of the ink be maximized. Therefore, mixing is suitably carried out in a conventional apparatus which mixes in combination with subjecting the dispersion to high shearing action.

In preparing the subject inks, the solid ingredients, i.e. the copper powder, and the two components of the glass frit, are reduced to a particle size of about 1–5 micrometers and thoroughly mixed. The solid particles are combined with the organic vehicle and thoroughly mixed to form the ink.

The copper via-fill inks of this invention are applied to a substrate structure by conventional means, i.e. screen printing, brushing, spraying and the like, with screen printing being preferred. The subject inks are applied to overlie a first level copper metallization comprising a patterned layer of copper on a suitable substrate. The subject inks may likewise be utilized to form copper via-fills between subsequent layers of copper metallization. The subject inks are applied in alternating sequence with patterned layers of a suitable dielectric material, i.e. the dielectric ink is applied and fired and the copper via ink applied and fired to fill vias in the dielectric layer. The copper via-fill comprises on a weight basis: from about 59 to about 84 percent by weight of copper powder and from about 16 to about 31 percent by weight of the glass frit. The deposition and firing of dielectric and copper via-fill inks is repeated until the desired thickness of dielectric material between layers of metallization is achieved. In general, at least two layers of dielectric/copper via-fill about 40 micrometers thick are required to form a dielectric separation between layers of metallization.

Copper via fills or post-ups formed from the subject inks have excellent mechanical strength, reheat stability and conductivity. Moreover, they have been demonstrated to be exceptionally resistant to microcracking and separation due to interaction with adjacent dielectric material.

The following Example further illustrates this invention, it being understood that the invention is in no way intended to be limited to the details described therein. In the Example, all parts and percentages are on a weight basis and all temperatures are in degrees Celsius, unless otherwise stated.

EXAMPLE

A copper via-fill ink was prepared as follows: a devitrifying glass frit consisting of: 21.8 percent of zinc oxide; 16.5 percent of magnesium oxide; 7.8 percent of barium oxide; 39.2 percent of silicon dioxide; 10.7 percent of aluminum oxide; 1.0 percent of phosphorus pentoxide; and 3.0 percent of zirconium silicate and a vitreous glass frit consisting of: 51.59 percent of barium oxide; 12.58 percent of calcium oxide; 15.62 percent of boron trioxide and 20.21 percent of silicon dioxide were separately prepared and reduced to a particle size of about three micrometers. Solid ingredients consisting of 65 percent of copper powder having an average particle size of three micrometers, 14 percent of the devitrifying glass frit and 4 percent of the vitreous glass frit were thoroughly mixed by hand.

The solid ingredients were mixed with 17 parts of an organic vehicle consisting of a 20 percent solution of poly(isobutylmethacrylate) in Texanol which additionally contained, as wetting agents, 17 percent of Hypothiolate 100 and 3 percent of Armeen O. The ink was initially hand-mixed and then mixed on a three-roll mill to obtain a paste suitable for screen printing. Additional solvent was added as necessary to assure proper rheology.

A copper base layer ink was prepared in the same manner from 76.9 parts of copper powder, 15.4 parts of the above described organic vehicle and the remainder a glass frit comprised of 9.09 percent of zinc oxide; 30.40 percent of calcium oxide; 18.28 percent of aluminum oxide and 42.23 percent of silicon dioxide. This ink is described in copending U.S. patent application Ser. No. 914,303 of Prabhu et al. Entitled "THICK-FILM COPPER CONDUCTOR INKS" filed Oct. 2, 1986.

A dielectric ink was prepared in the same manner from 67.7 parts of a glass frit, 5.8 parts of alumina, 3.9 parts of barium dimagnesium disilicate having an average particle size of about three micrometers and 22.6 parts of a vehicle comprising a 20 percent solution of poly(isobutylmethacrylate) in Texanol which also contained one percent of the wetting agent Duomeen TDO. The glass frit had the composition: 21.81 percent of zinc oxide, 19.25 percent of magnesium oxide, 5.88 percent of barium oxide, 9.38 percent of aluminum oxide, 39.68 percent of silicon dioxide, 2.00 percent of phosphorus pentoxide and 2.00 percent of zirconium silicate. This ink is described in a copending U.S. patent application Ser. No. 914,302 of Hang et al. entitled "DIELECTRIC INKS FOR MULTILAYER COPPER CIRCUITS" filed Oct. 2, 1986.

Conventional alumina boards were utilized as substrates. The boards were coated with a patterned layer of the copper ink which was applied, air-dried at 125° for 15 minutes and fired in nitrogen at 900° for 10 minutes. A patterned layer of the dielectric ink was deposited thereover, dried and fired in the same manner leaving openings overlying a portion of the copper conductor. The subject via-fill ink was printed into the spaces, dried in air at 125° for 15 minutes, and fired in nitrogen at 900° for 10 minutes. The thickness of the layer of dielectric/copper via-fill was 15 micrometers. The dielectric/copper via-fill depositions were repeated 3 times to form a final thickness of 45 micrometers. A layer of the copper conductor was deposited over the structure so that a portion was in contact with the copper via fill. This procedure was repeated three times to obtain a structure having four buried copper layers. In total, 25 firings were required from the initial firing of the first deposition of the copper conductor ink through the firing of the final copper conductor layer.

The structure was biased through electrical contacts made to the copper conductor layers. No evidence of shorting or separation of the copper via fills was observed.

We claim:
1. A copper via-fill conductor ink comprising from about 55 to about 80 weight percent copper powder and from about 15 to about 30 weight percent glass frit which comprises (1) a major portion of devitrifying glass comprising, on a weight percent basis,
   (a) from about 15 to about 25 percent zinc oxide;
   (b) from about 10 to about 25 percent magnesium oxide;
   (c) from about 3 to about 12 percent barium oxide;
   (d) from about 5 to about 20 percent aluminum oxide;
   (e) from about 35 to about 50 percent silicon dioxide;
   (f) from about 0.5 to about 3 percent phosphorus pentoxide; and
   (g) from about 1 to about 5 percent zirconium silicate, and (2) a minor portion of vitreous glass comprising on a weight percent basis,
   (a) from about 40 to about 55 percent barium oxide;
   (b) from about 10 to about 15 percent calcium oxide;
   (c) from about 14 to about 25 percent boron trioxide; and
   (d) from about 13 to about 23 percent silicon dioxide; and from about 5 to about 25 weight percent of an organic vehicle.
2. The ink composition of claim 1 wherein the devitrifying glass comprises, on a weight basis,
   (a) from about 16 to about 22 percent of zinc oxide;
   (b) from about 16 to 22 percent of magnesium oxide;
   (c) from about 5 to about 10 percent of barium oxide;
   (d) from about 8 to about 11 percent of aluminum oxide;
   (e) from about 39 to about 43 percent of silicon dioxide;
   (f) from about 1 to about 2 percent of phosphorus pentoxide; and
   (g) from about 2 to about 3 percent of zirconium silicate.
3. The ink composition of claim 1 wherein the vitreous glass comprises, on weight basis,
   (a) from about 40 to about 55 percent of barium oxide;
   (b) from about 10 to about 15 percent of calcium oxide;
   (c) from about 14 to about 25 percent of boron trioxide; and
   (d) from about 13 to about 23 percent of silicon dioxide.
4. The ink composition of claim 1 wherein the weight to weight ratio of devitrifying glass to vitreious glass is from about 2:1 to about 20:1.
5. The ink composition of claim 1 wherein the weight to weight ratio of devitrifying glass to vitreous glass is from about 3:1 to about 5:1.
6. The ink composition of claim 1 wherein the amount of devitrifying glass is from about 70 to about 95 weight percent and the amount of vitreous glass is from about 5 to about 30 weight percent, based on the total weight of glass frit in the ink composition.
7. A copper via-fill conductor ink according to claim 1, wherein the ink comprises, on a weight basis: from about 60 to about 70 percent of copper powder; from about 18 to about 25 percent of the glass frit; and from about 15 to about 20 percent of the suitable organic vehicle.

8. A copper via-fill conductor ink according to claim 5, wherein the organic vehicle is a solution of an organic binder in a suitable solvent.

9. A copper via-fill conductor ink according to claim 8, wherein the binder is poly(isobutylmethacrylate).

* * * * *